(12) United States Patent
Sah et al.

(10) Patent No.: US 10,187,070 B2
(45) Date of Patent: Jan. 22, 2019

(54) LOCAL OSCILATOR DISTRIBUTION AND PHASE SHIFTING CIRCUITS

(71) Applicant: WASHINGTON STATE UNIVERSITY, Pullman, WA (US)

(72) Inventors: Suman P Sah, Vista, CA (US); Deukhyoun Heo, Pullman, WA (US)

(73) Assignee: Washington State University, Pullman, WA (US)

( * ) Notice: Subject to any disclaimer, the term of this patent is extended or adjusted under 35 U.S.C. 154(b) by 222 days.

(21) Appl. No.: 15/039,380

(22) PCT Filed: Nov. 20, 2014

(86) PCT No.: PCT/US2014/066530
§ 371 (c)(1),
(2) Date: May 25, 2016

(87) PCT Pub. No.: WO2015/080930
PCT Pub. Date: Jun. 4, 2015

(65) Prior Publication Data
US 2017/0170834 A1    Jun. 15, 2017

Related U.S. Application Data

(60) Provisional application No. 61/908,944, filed on Nov. 26, 2013.

(51) Int. Cl.
*H03L 7/099* (2006.01)
*H03L 7/00* (2006.01)
(Continued)

(52) U.S. Cl.
CPC ........... *H03L 7/099* (2013.01); *H03B 5/1203* (2013.01); *H03B 5/124* (2013.01); *H03B 5/1212* (2013.01);
(Continued)

(58) Field of Classification Search
CPC .......... H04B 7/00; H03B 1/00; H03B 5/1212; H03B 5/1296; H03B 5/1231;
(Continued)

(56) References Cited

U.S. PATENT DOCUMENTS 3,370,254 A    2/1968  Keller
3,427,544 A    2/1969  Wolfram
(Continued)

OTHER PUBLICATIONS

International Search Report and Written Opinion dated Feb. 12, 2015, in International Application No. PCT/US14/066530, 10 pages.

*Primary Examiner* — Arnold Kinkead
(74) *Attorney, Agent, or Firm* — Liang IP, PLLC

(57) ABSTRACT

Electronic devices, local oscillator circuits, and methods for operating local oscillators are disclosed herein. In one embodiment, a local oscillator circuit includes a first transistor and a second transistor individually having a base, a collector, and an emitter and a transformer having a first transformer inductor magnetically coupled to a second transformer inductor. The first transformer inductor couples the collector of the first transistor to the base of the second transistor. The second transformer inductor couples the collector of the second transistor to the base of the first transistor.

20 Claims, 7 Drawing Sheets

(51) Int. Cl.
*H04B 7/00* (2006.01)
*H03B 5/12* (2006.01)
*H03D 7/16* (2006.01)

(52) U.S. Cl.
CPC ......... *H03B 5/1231* (2013.01); *H03B 5/1237* (2013.01); *H03B 5/1296* (2013.01); *H03D 7/165* (2013.01); *H03L 7/00* (2013.01); *H04B 7/00* (2013.01); *H03B 2200/0072* (2013.01); *H03B 2200/0074* (2013.01)

(58) Field of Classification Search
CPC .......... H03B 5/1203; H03B 2200/0074; H03B 2200/0072; H03B 5/124; H03B 5/1237; H03D 7/165
USPC ............. 331/167, 116 FE; 455/260; 307/104
See application file for complete search history.

(56) References Cited

U.S. PATENT DOCUMENTS

| | | | |
|---|---|---|---|
| 5,140,705 A * | 8/1992 | Kosuga | H03D 7/1441 455/318 |
| 5,629,652 A | 5/1997 | Weiss | |
| 2006/0181355 A1* | 8/2006 | Copani | H03B 5/1231 331/36 L |
| 2007/0182502 A1* | 8/2007 | Shin | H03B 5/1228 331/167 |
| 2009/0231047 A1 | 9/2009 | Jang et al. | |
| 2012/0214429 A1 | 8/2012 | Goyal et al. | |

* cited by examiner

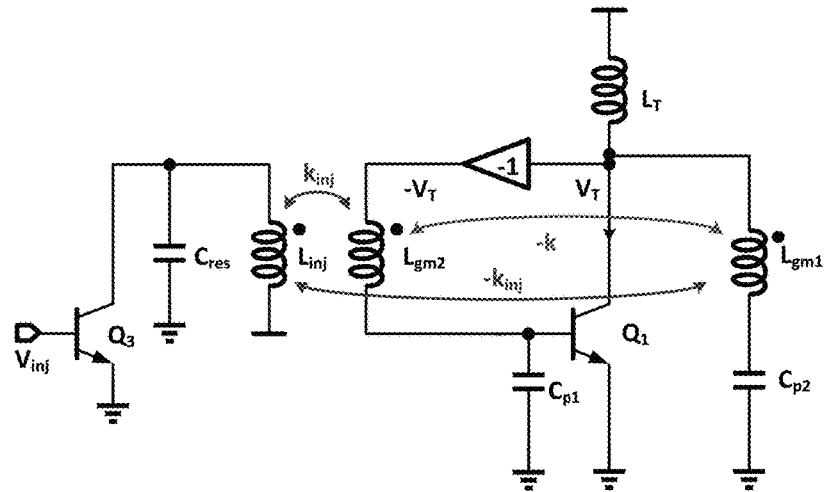
*FIG. 3B*
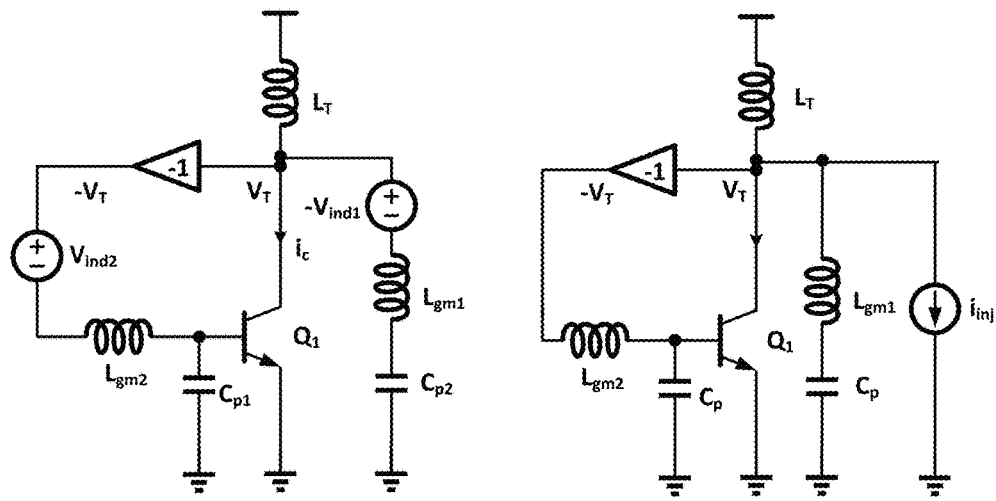
*FIG. 3C*  *FIG. 3D*

LOCAL OSCILLATOR DISTRIBUTION AND PHASE SHIFTING CIRCUITS

CROSS-REFERENCE TO RELATED APPLICATION(S)

This application is a U.S. National Stage Application of PCT Application No. PCT/US14/66530, filed Nov. 20, 2014, which claims priority to U.S. Provisional Application No. 61/908,944, entitled "A LOW POWER LO DISTRIBUTION AND PHASE-SHIFTING SCHEME FOR HIGH-FREQUENCY BEAMFORMING," filed Nov. 26, 2013.

BACKGROUND

With rapid growth in wireless usage by smart phones, tablet computers, and other mobile computing devices, wireless operators are constantly looking for ways to improve operating efficiencies of wireless networks. Multiple input/multiple output ("MIMO") is one technique that has been utilized to improve network throughput, capacity, and coverage. MIMO typically involves receiving and/or transmitting signals via multiple receivers and/or transmitters. For example, a smartphone may include two or more antennas individually configured to receive a corresponding signal. The received signals can then be combined into a aggregate signal by applying a phase shift and/or amplitude control to at least one of the received signals in a process commonly referred to as beamforming. The individual signals received at the antennas can carry different information, and thus may increase communications throughput to the computing device via an existing wireless network.

BRIEF DESCRIPTION OF THE DRAWINGS

FIGS. 3A-3D are schematic circuit diagrams showing a signal processor having a sub-harmonic injection-locked local oscillator ("SILO") in accordance with embodiments of the disclosed technology.

DETAILED DESCRIPTION

Specific details of several embodiments of the technology are described below with reference to electronic devices, local oscillator circuits, and methods for operating local oscillators. Several embodiments can have configurations, components, or procedures different than those described in this section, and other embodiments may eliminate particular components or procedures. A person of ordinary skill in the relevant art, therefore, would understand that the technology may have other embodiments with additional elements, and/or may have other embodiments without several of the features shown and described below with reference to FIGS. 1-9.

In wireless communications devices, incoming radio frequency ("RF") signals are typically digitized using analog-to-digital converters before further digital processing can be performed. However, directly digitizing high frequency RF signals (e.g., greater than 30 MHz) can be costly. As such, local oscillators ("LO") are often used to shift frequencies of incoming RF signals to intermediate frequencies ("IF") before digitization. However, local oscillator routing at high frequencies tends to be power hungry and extremely sensitive to routing parasitic and routing symmetry. Several embodiments of the disclosed technology utilize sub-harmonic LO routing with an injection locked voltage controlled oscillator ("VCO") to address at least some of the foregoing difficulties. As a result, the LO routing can be less sensitive to layout parasitic and has lower power consumption levels than conventional techniques.

Figure 1:
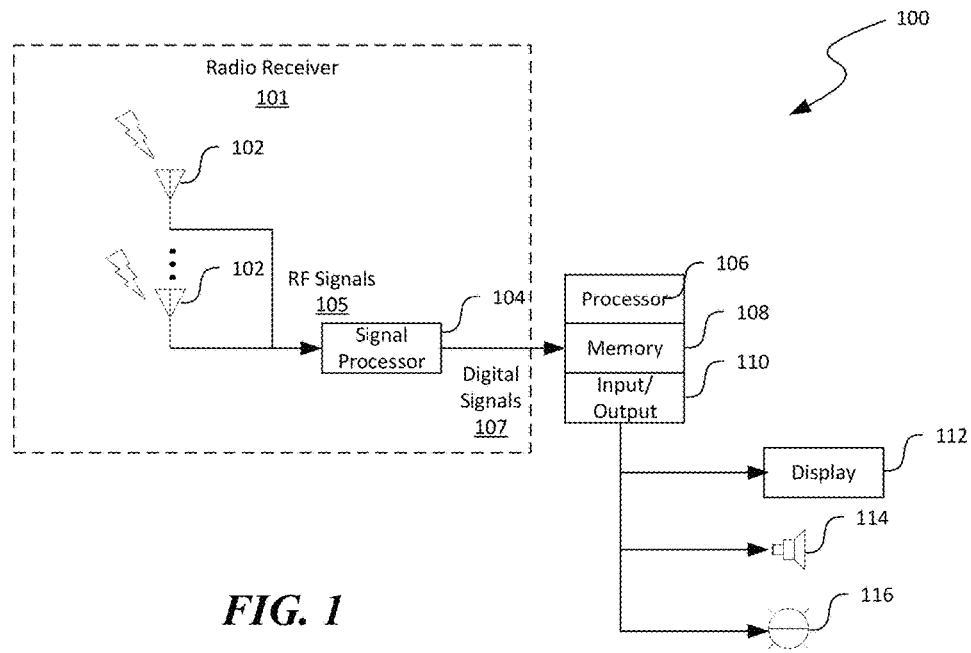
FIG. 1 is a schematic diagram of an electronic device in accordance with embodiments of the disclosed technology.

FIG. 1 is a schematic diagram of an electronic device 100 in accordance with embodiments of the disclosed technology. The electronic device 100 can be a smartphone, a tablet computer, a laptop computer, or other suitable types of device. As shown in FIG. 1, the electronic device 100 can include a radio receiver 101, a processor 106, a memory 108, and an input/output component 110 operatively coupled to one another. The radio receiver 101 can include one or more antennas 102, a signal processor 104. Two antennas 102 are shown for illustration purposes though the radio receiver 101 can include any suitable number of antennas. The electronic device 100 can also include one or more of a display 112 (e.g., a touchscreen), a speaker 114, or a light 116 (e.g., an LED). Even though only certain components are shown in FIG. 1, in other embodiments, the electronic device 100 can also include sensors, power/signal ports, and/or other suitable components.

The processor 106 can include a microprocessor, a field-programmable gate array, and/or other suitable logic devices. The memory 108 can include non-transitory volatile and/or nonvolatile media (e.g., ROM; RAM, magnetic disk storage media; optical storage media; flash memory devices, and/or other suitable storage media) and/or other types of computer-readable storage media configured to store data received from, as well as instructions for, the processor 106. As used herein, the term "computer-readable storage media" excludes propagated signals. The input/output component 110 can include a driver for the display 112, the speaker 114, the light 116, or other suitable types of input/output devices (e.g., a keyboard, a mouse, or a printer).

The signal processor 104 can be configured to process incoming RF signals 105 received at the antennas 102 into digital signals 107. The signal processor 104 can then provide the digital signals 107 to the processor 106 for further processing. For example, in one embodiment, the digital signals 107 may contain a media stream (e.g., a movie), and the processor 106 can execute a suitable application program and produce media frames to be output to the display 112 and corresponding audio output to the speaker 114. As described in more detail below with reference to FIG. 2, several embodiments of the signal processor 104 can utilize a SILO for converting the RF signals 105 into IF signals (not shown) before digitization.

Figure 2:
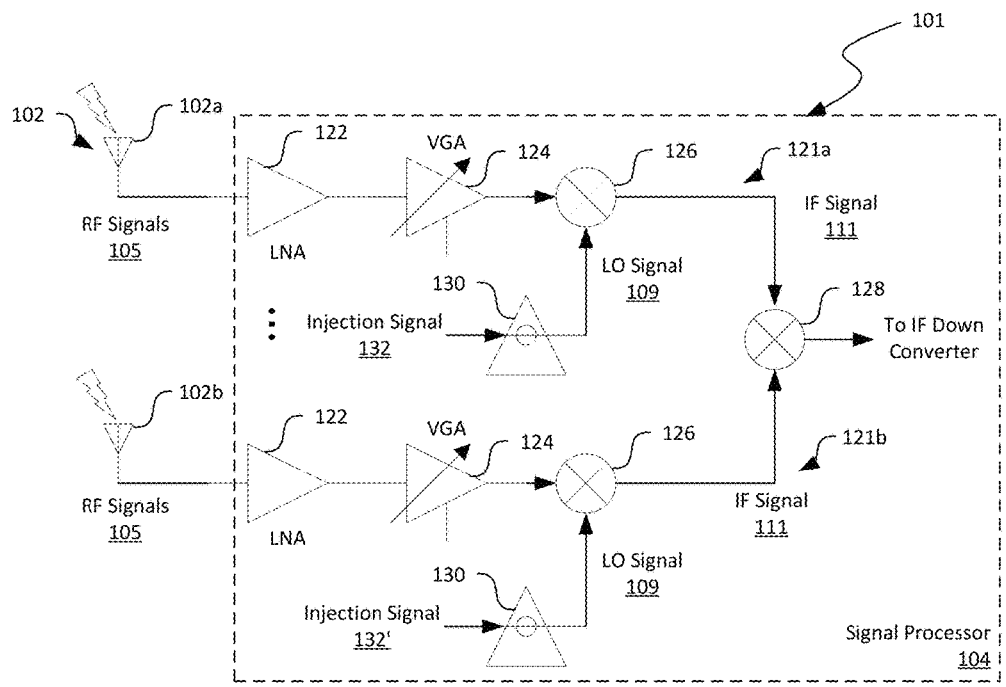
FIG. 2 is a schematic diagram showing a radio receiver suitable for the electronic device of FIG. 1 in accordance with embodiments of the disclosed technology.

FIG. 2 is a schematic diagram showing a radio receiver 101 suitable for the electronic device 100 of FIG. 1 in accordance with embodiments of the disclosed technology. As shown in FIG. 2, the signal processor 104 can include a first branch 121a coupled to the first antenna 102a and a second branch 121b coupled to the second antenna 102b. Each of the first and second branches 121a and 121b can include a low noise amplifier ("LNA") 122, a variable gain amplifier ("VGA") 124, a mixer 126, and a SILO 130 operatively coupled to one another. The first and second branches 121a and 121b merge at the IF summer 128 before an IF down converter (not shown) or before an analog-to-digital converter (not shown). Even though only two branches 121a and 121b are shown in FIG. 2, in other embodiments, the signal processor 104 can include any other suitable number of branches.

The low noise amplifier 122 is configured to amplify the RF signal 105 captured by the corresponding antenna 102. The variable gain amplifier 124 can be configured to scale the captured RF signal 105 before providing the RF signal 105 to the mixer 126. The low noise amplifier 122 and the variable gain amplifier 124 can include any suitable implementations. For example, the low noise amplifier 122 can be implemented using junction gate field-effect transistors, hetero-structure field effect transistors, and/or other suitable components. In another example, the variable gain amplifier 124 can be implemented using a voltage-controlled resistor to set a gain of the variable gain amplifier 124.

The SILO 130 is configured to generate a local oscillation signal 109 to the mixer 126 based on an injection signal 132 from, for example, a phase locked loop ("PLL," not shown) or other suitable sources. The local oscillation signal 109 has both (1) a target frequency and (2) a target phase angle for shifting the frequency and phase angle of the RF signal 105. In certain embodiments, the injection signal 132 can be $N^{th}$ sub-harmonic to the LO signal 109. N is a positive integer that can be 2, 3, 4, 5, 6, 7, 8, or other suitable values. The injection signal 132 ($V_{inj}$) can be represented by the following:

$$V_{inj} = C \sin(\overline{\omega}_0 t/N + \Phi_{inj})$$

where C is amplitude, $\overline{\omega}_0$ is the target frequency of the LO signal 109, and $\Phi_{inj}$ is a phase angle of the injection signal 132. As such, the SILO 130 is configured to generate the local oscillation signal 109 at the target frequency ($\overline{\omega}_0$) by multiplying the frequency and phase angle ($\Phi_{inj}$) of the injection signal 132 by N, as follows:

$$V_{LO} = C \cos(\overline{\omega}_0 t/N + \Phi_{inj})$$

In other embodiments, the injection signal 132 can have other suitable frequency and/or phase angle values. Example circuits for implementing the SILO 130 are described in detail below with reference to FIGS. 3 and 4.

The mixer 126 is configured to generate an IF signal 111 based on the RF signal 105 from the VGA 124 and the LO signal 109 from the SILO 130. The IF signal 111 can have a frequency that is a difference between frequencies of the RF signal 105 and the LO signal 109. For example, the RF signal 105 can have a frequency of 824 to 849 MHz, and the LO signal has a frequency of 823 MHz. Thus, the IF signal 111 can have a frequency of 1-26 MHz. The mixer 126 can include a suitable nonlinear electrical circuit (e.g., using diodes or switches) that generates a signal with new frequencies based on input signal frequencies.

The IF summer 128 is configured to combine the IF signals 111 from the first and second branches 121a and 121b and provide the combined signal to an IF down converter (not shown), an analog-to-digital converter (not shown), and/or other suitable components for further processing. In certain embodiments, the IF summer 128 can have similar structures and/or functions as the mixer 126. In other embodiments, the IF summer 128 can have different structures and/or functions than the mixer 126.

In operation, the antennas 102 capture the RF signals 105, which are then suitably amplified by the low noise amplifiers 122 and the variable gain amplifiers 124. The SILOs 130 generates local oscillation signals 109 with corresponding target frequency and phase angle based on the injection signals 132. In certain embodiments, the injection signals 132 are sub-harmonic to the local oscillation signals 109. Thus, the SILO 130 generates the local oscillation signals 109 by multiplying the frequency and phase angle by the sub-harmonic number of the injection signal 132. As described in more detail below with reference to FIG. 3, the signal processor 104 can also include a digital controller (not shown) configured to control the phase angle of the local oscillation signals 109 based on a signal from the SILO 130. The mixers 126 can then combine the amplified RF signals 105 and the local oscillation signals 109 to generate the IF signals 111. The IF summer 128 can then combine the IF signals 111 before providing a combined signal to IF down converter or other suitable downstream processing components.

Figure 3A:
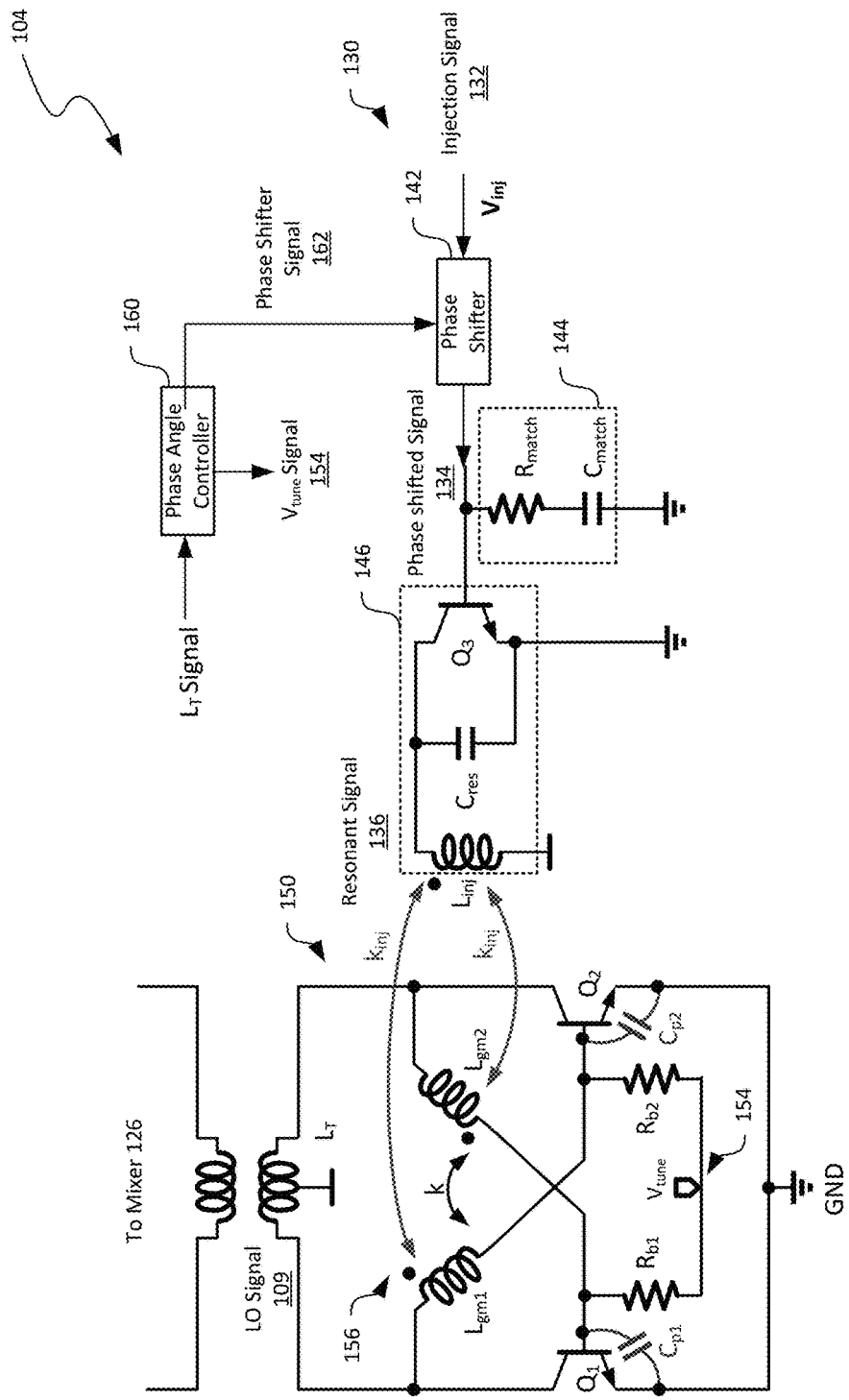

FIG. 3A is a schematic circuit diagram showing a signal processor 104 having a sub-harmonic injection-locked local oscillator ("SILO") 130 in accordance with embodiments of the disclosed technology. As shown in FIG. 3A, in the illustrated embodiment, the signal processor 104 includes a phase angle controller 160 (e.g., a digital controller) operatively coupled to the SILO 130. The phase angle controller 160 is configured to control a phase angle of output local oscillator signal 109 by adjusting a tuning voltage ($V_{tune}$) to the SILO 130 based on, for example, a phase measurement signal from an output inductor $L_T$, as described in more detail below. In other embodiments, the phase angle controller 160 may be a component separate from the signal processor 104.

As shown in FIG. 3A, the SILO 130 can include a phase shifter 142, a matching filter 144, a resonance tank 146, and a transformer-coupled oscillator 150 operatively coupled to one another. Even though particular components of the SILO 130 are shown in FIG. 3A, in other embodiments, the SILO 130 can include fewer components. For example, in certain embodiments, the phase shifter 142 may be omitted. In further embodiments, the SILO 130 may include additional and/or different components, one example of which is described below with reference to FIG. 4.

In certain embodiments, the phase shifter 142 is configured to controllably shift a phase angle of the injection signal 132 by 180° divided by the sub-harmonic number N of the injection signal 132. For example, when the sub-harmonic number of the injection signal 132 is 8, the phase shifter 142 is configured to shift a phase angle of the injection signal 132 by 180°/8=22.5°. Thus, the phase shifter 142 can shift a phase angle of 22.5° of the injection signal 132 to generate an LO signal 109 having a phase angle of 8×22.5°=180°. In other embodiments, the phase shifter 142 can also be configured to controllably shift a phase angle of the injection signal 132 by other suitable values. The phase shifter 142 can be implemented using PIN diodes, CMOS switches, and/or other suitable components. One example phase shifter is described in a Publication entitled "An 8-Channel Ku Band Transmit Beamformer with Low Gain/Phase Imbalance Between Channels" by Siqi Zhu et al., the disclosure of which is incorporated herein in its entirety.

In the illustrated embodiment, the phase angle controller 160 can achieve controllable phase shifting by enabling (or disabling) the phase shifter 142 with a phase shifter signal 162. For instance, in the example above, if the phase angle controller 160 enables the phase shifter 142, the output from the LO signal 109 would be 180°; otherwise, the output would be 0°. Thus, in certain embodiments, the phase angle controller 160 can enable the phase shifter 142 when a target phase shift between the local oscillator signal 109 and the injection signal 132 is greater than 180° and disable the phase shifter 142 when the target phase shift is less than or equal to 180°. In other embodiments, the phase angle controller 160 can control the phase shifter 142 in other suitable manners.

The matching filter 144 can be configured to transform an impedance seen at the base of the transistor Q3 to a desired characteristic impedance so as to match the output from the phase shifter 142. As shown in FIG. 3A, in the illustrated embodiment, the matching filter 144 includes a resistor $R_{match}$ coupled to ground via a matching capacitor $C_{match}$. The resistance and capacitance of the resistor $R_{match}$ and matching capacitor $C_{match}$ can be selected based at least in part on a frequency of the injection signal 132. In other embodiments, the matching filter 144 can also include other suitable components in suitable arrangements. In further embodiments, the matching filter 144 may be omitted.

The resonance tank 146 can be configured to generate a resonance signal 136 at a target frequency of the local oscillator signal 109. In the illustrated embodiment, the resonance tank 146 includes an LC circuit having a transistor Q3, a resonance capacitor $C_{res}$, and an injection inductor $L_{inj}$ operatively coupled to one another. The phase shifted signal 134 is coupled to the base of the transistor Q3. The capacitor $C_{res}$ is coupled between the collector and emitter of the transistor Q3. The injection inductor $L_{inj}$ is coupled to the collector of the transistor Q3. In certain embodiments, the inductance value ($L_{inj}$) of the injection inductor $L_{inj}$ and a capacitance value ($C_{res}$) of the resonance capacitor $C_{res}$ can be selected based on the target frequency ($f_{LO}$) as follows:

$$f_{LO} = \frac{1}{2\pi\sqrt{L_{inj}C_{res}}}$$

where $f_{LO}$ is the frequency of the local oscillator signal 109. In other embodiments, the injection inductor $L_{inj}$ and the resonance capacitor $C_{res}$ can have other suitable inductance and capacitance, respectively.

The transformer-coupled oscillator 150 can be configured to produce the local oscillator signal 109 at a target frequency and phase angle based on (1) the injected resonant signal 136 and (2) a tuning signal $V_{tune}$ 154 from the phase angle controller 160. As shown in FIG. 3A, the transformer-coupled oscillator 150 can include first transistor Q1 and second transistor Q2 cross-coupled by a transformer 156. Each of the first transistor Q1 and second transistor Q2 include a base, a collector, and an emitter. As showing in FIG. 3, the emitters of the first and second transistors Q1 and Q2 are coupled to ground. The collectors of the first and second transistors Q1 and Q2 are coupled to opposite terminals of an output inductor LT coupled to the mixer 126. The first and second transistors Q1 and Q2 also includes a parasitic capacitance $C_{p1}$ and $C_{p2}$ between respective base and emitter, respectively. The tuning signal $V_{tune}$ 154 is used to bias the bases of the first and second transistors Q1 and Q2 via respective isolation resisters $R_{b1}$ and $R_{b2}$. In the following description, the first and second transistors Q1 and Q2 are generally similar in structure and function. As a result, the parasitic capacitance $C_{p1}$ and $C_{p2}$ are generally the same and represented as $C_p$. In other embodiments, the first and second transistors Q1 and Q2 can be metal oxide semiconductor devices or may have different structures and/or functions.

The transformer 156 $L_{gm}$ can have a first transformer inductor $L_{gm1}$ magnetically coupled to a second transformer inductor $L_{gm2}$ with a coupling factor k. The first and second transformer inductors $L_{gm1}$ and $L_{gm2}$ can have an additive relative polarity. The transformer 156 is electrically coupled to the first and second transistors Q1 and Q2. In particular, the first transformer inductor $L_{gm1}$ is coupled to the collector of the first transistor Q1 at one end and coupled to the base of the second transistor Q2 at the other end. The second transformer inductor $L_{gm2}$ is coupled to the collector of the second transistor Q2 at one end and coupled to the base of the first transistor Q1 at the other end.

The injection inductor $L_{inj}$, the first transformer inductor $L_{gm1}$, and the second transformer inductor $L_{gm2}$ are magnetically coupled to one another with select polarities between pairs of these inductors. Both the first transformer inductor $L_{gm1}$ and the second transformer inductor $L_{gm2}$ are magnetically coupled to the injection inductor $L_{inj}$ with a coupling factor $k_{inj}$ but different directions of coupling. FIG. 3B is an equivalent circuit for part of the SILO 130 in FIG. 3A. As shown in FIG. 3B, the injection inductor $L_{inj}$ and the first transformer inductor $L_{gm1}$ have a subtractive relative polarity. The injector inductor $L_{inj}$ and the second transformer inductor $L_{gm2}$ have an additive relative polarity. The particular polarities between pairs of the foregoing inductors and the direction of coupling allows the injected signal $V_{inj}$ to be constructively injected into the base of the first and second transistors Q1 and Q2. As a result, a high subharmonic injection efficiency can be achieved, as explained in more detail below.

FIG. 3C is another equivalent circuit for that shown in FIG. 3B in which the voltages generated as a result of the injection signal $V_{inj}$ are converted to and represented by a first voltage source $V_{ind1}$ and a second voltage source $V_{ind2}$. Each of the first voltage source $V_{ind1}$ and a second voltage source $V_{ind2}$ can have a voltage value $V_{ind}$ given by the following:

$$V_{ind} = k_{inj} G_{m,Q3} Z_L V_{inj}$$

where $G_{m,Q3}$ is the transconductance of the transistor Q3, $Z_L$ is the impedance due to the resonant tank 146 formed by the injection inductor $L_{inj}$ and the resonance capacitor $C_{res}$. The transconductance $G_{m,Z}$ can be calculated as follows:

$$G_{mZ} = \frac{\bar{\omega}C_p}{1 - \bar{\omega}^2 L_{gm} C_p}$$

where $C_p$ is the capacitance of $C_{p1}$ and $C_{p2}$. The transconductance of the local oscillator 150 can be represented by:

$$G_{m,osc} = \frac{1}{1 - \bar{\omega}^2 L_{gm} C_p} G_{m,Q1}$$

FIG. 3D is yet another equivalent circuit for that shown in FIG. 3C in which the first and second voltage sources $V_{ind1}$ and $V_{ind2}$ are converted and represented by a current source $i_{inj}$ as follows:

$$i_{inj} = (G_{m,osc} + G_{mZ})V_{ind}$$

In certain embodiments, $G_{m,osc}$ and $G_{mZ}$ can have equal values, and such injection enhances the injection current by roughly a factor of 2.

Without being bound by theory, the introduction of the transformer 156 $L_{gm}$ is believed to result in increased swing at the base of the first and second transistors $Q_1$ and $Q_2$, leading to transconductance ($G_m$) enhancement as follows:

$$G_m = \frac{-(1+k)}{1-(\omega_{osc}/\omega_{SRF})^2} G_{m,old}$$

where $G_{m,old}$ is the transconductance for a local oscillator similar to that shown in FIG. 3A but without the transformer 156, $\omega_{SRF} = 1/\sqrt{L_{gm}C_p}$ is the self-resonant frequency of the transformer 156 $L_{gm}$ and the parasitic capacitor $C_p$ and $\omega_{osc}$ is the oscillation frequency. It is believed that the transformer-coupled local oscillator 150 can operate at a low supply voltage while consuming less power than conventional local oscillators due to the foregoing transconductance enhancement. As a result, low power operation of the electronic device 100 is achieved.

Referring back to FIG. 3A, in operation, the resonant signal 136 having the target frequency $f_{LO}$ and a phase angle is injected into the transformer-coupled oscillator 150 via the transformer 156. As a result, the transformer-coupled oscillator 150 is forced to oscillate at the injected target frequency $f_{LO}$. The phase angle controller 160 can then adjust the capacitance of the parasitic capacitors $C_{p1}$ and $C_{p2}$ of the first and second transistors $Q_1$ and $Q_2$ by adjusting the tuning signal $V_{tune}$ 154 in conjunction with the phase shifter 142 to achieve a target phase angle between 0° to 360° of the local oscillation signal 109.

Figure 4:
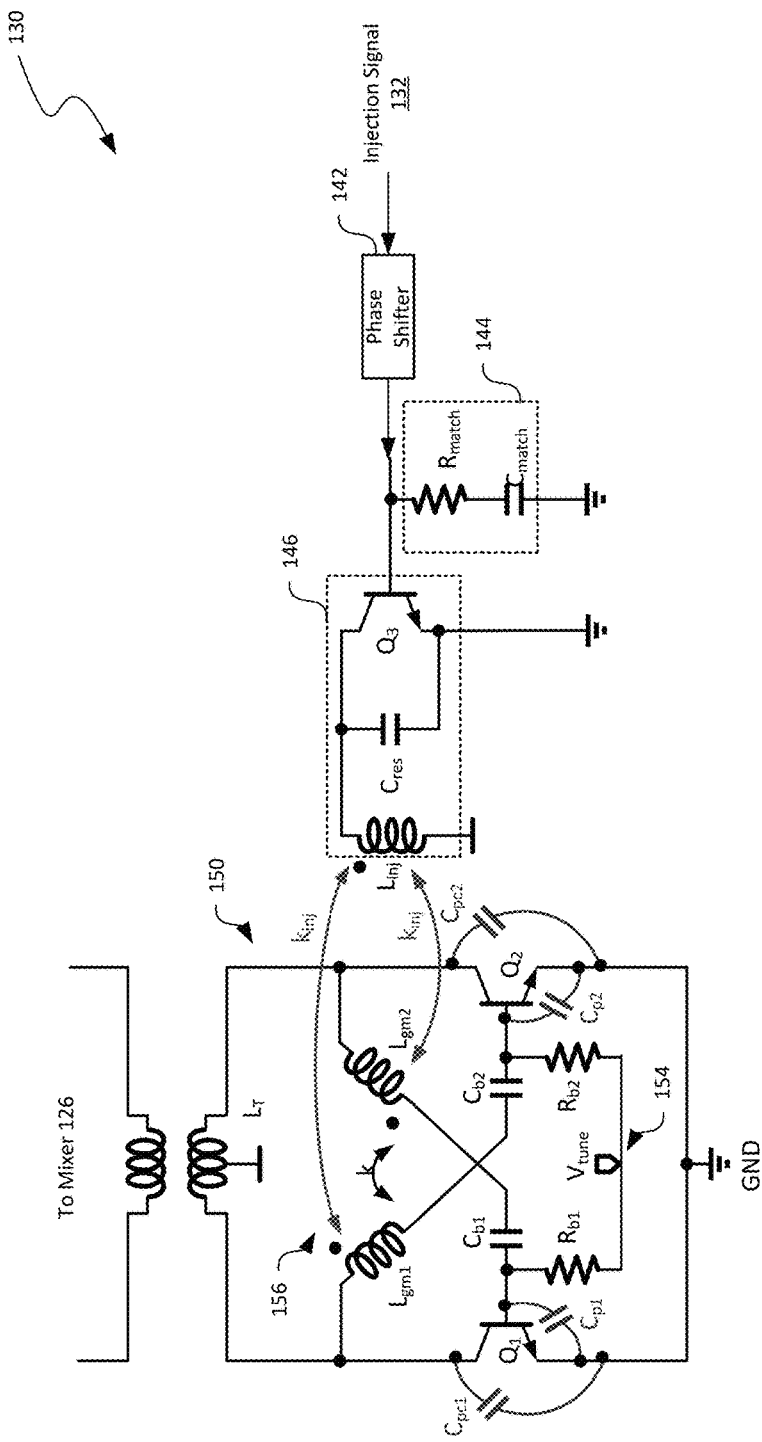
FIG. 4 is a schematic circuit diagram showing another SILO in accordance with embodiments of the disclosed technology.

FIG. 4 is a schematic circuit diagram showing another SILO 130 in accordance with embodiments of the disclosed technology. Certain components shown in FIG. 3A are omitted in FIG. 4 for clarity. As shown in FIG. 4, the transformer-coupled oscillator 150 can also include a first blocking capacitor $C_{b1}$ between the base of the first transistor $Q_1$ and the second transformer inductor $L_{gm2}$; and a second blocking capacitor $C_{b2}$ between the base of the second transistor $Q_2$ and the first transformer inductor $L_{gm1}$. Also shown in FIG. 4 are parasitic capacitors $C_{pc1}$ and $C_{pc2}$ between the collector and emitter of the first and second transistors $Q_1$ and $Q_2$, respectively.

Embodiments of the SILO 130 shown in FIG. 4 were implemented in TowerJazz 1P6M 0.13 μm Bi-CMOS process with two metal layers. For measurement purposes, a down-conversion mixer was implemented on chip. A 40 GHz continuous wave signal was used as an RF signal. The IF signal output was measured using an Agilent PXA 50 GHz signal analyzer. The SILO consumes a total power of 3.72 mW to 6.57 mW from a 0.5 V supply.

Figure 5:
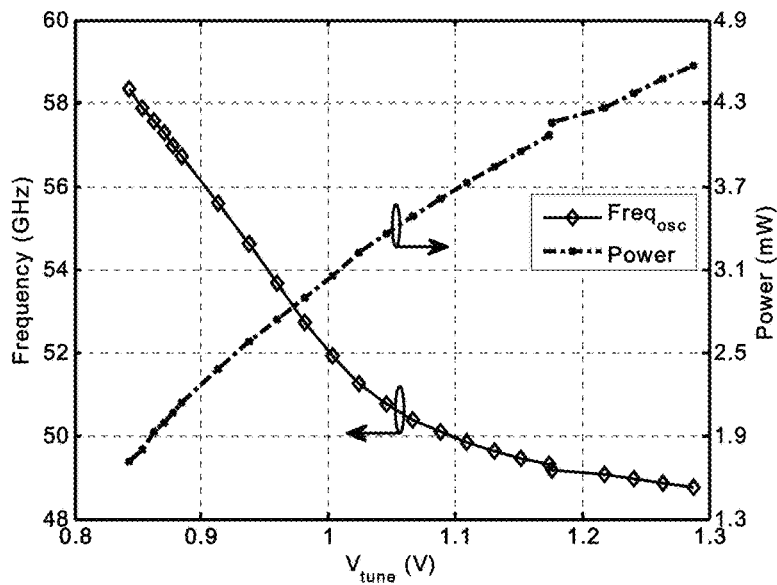
FIG. 5 is a graph showing measured a free-running tuning range of an example SILO and variation of power consumption versus tuning voltage in accordance with embodiments of the disclosed technology.

The free-running frequency of the SILO was controlled by independent base bias of the cross-coupling transistor pair. Free-running tuning range was measured by switching off the injection device Q3. The free-running tuning range of the SILO is shown in FIG. 5. The SILO achieved a tuning range of 17.9% centered at 53.5 GHz. FIG. 5 also shows the variation in power consumption over the tuning range.

Figure 6:
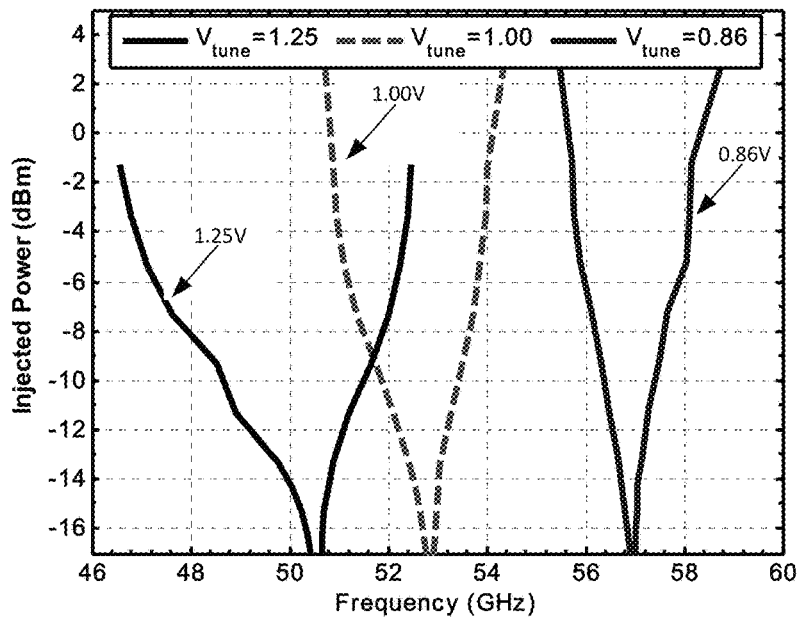
FIGS. 6 and 7 are graphs each showing a locking range of an example SILO when an $4^{th}$ and $8^{th}$ sub-harmonic signal is injected, respectively, in accordance with embodiments of the disclosed technology.
Figure 7:
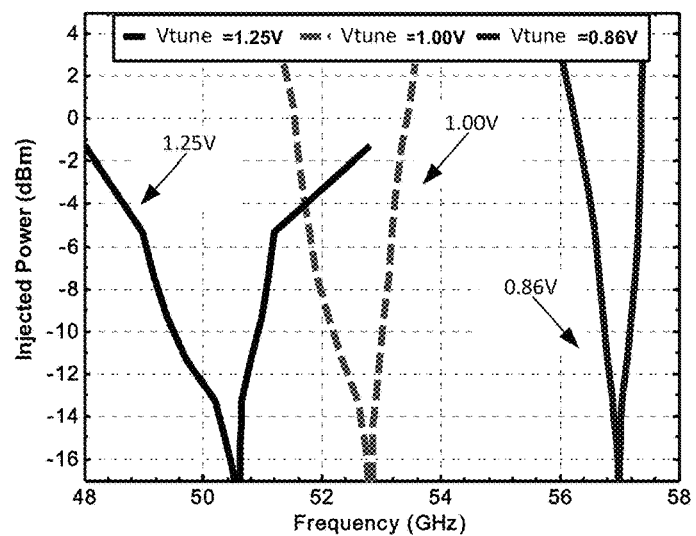
Figure 8:
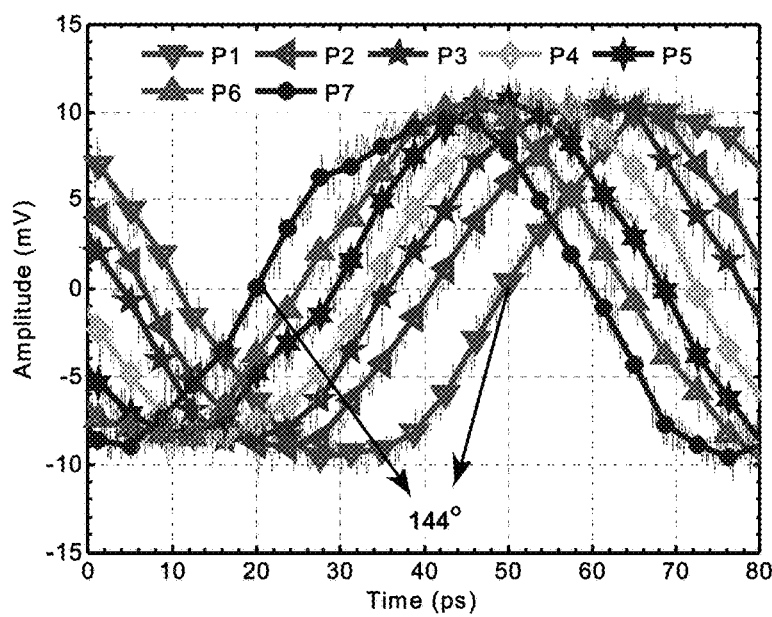
FIG. 8 is a graph showing measured phase shift output values for an example SILO in accordance with embodiments of the disclosed technology. The phase shift output was measured at 13.25 GHz, and phases P1-P7 correspond to the $V_{tune}$ of 0.946, 0.954, 0.960, 0.97, 0.975, 0.981, 0.984 volts, respectively

The measured $4^{th}$ and $8^{th}$ sub-harmonic (6-7.16 GHz) locking ranges of the SILO are shown in FIGS. 6 and 7, respectively. The locking range was measured at three different tuning voltages, i.e., 1.25V, 1.00V, and 0.86V. For a given input injection power, the injection frequency was varied until locking is observed. To eliminate the sub-harmonic local oscillator buffer amplifier, it is desirable that a large locking range be observed at low injected input power. The test SILO achieved a minimum locking range of 450 MHz at high band and 1.4 GHz locking range at low band with about −10 dBm input power. The SILO also achieved a phase-shifting range of greater than about 150°, as shown in FIG. 8.

Figure 9:
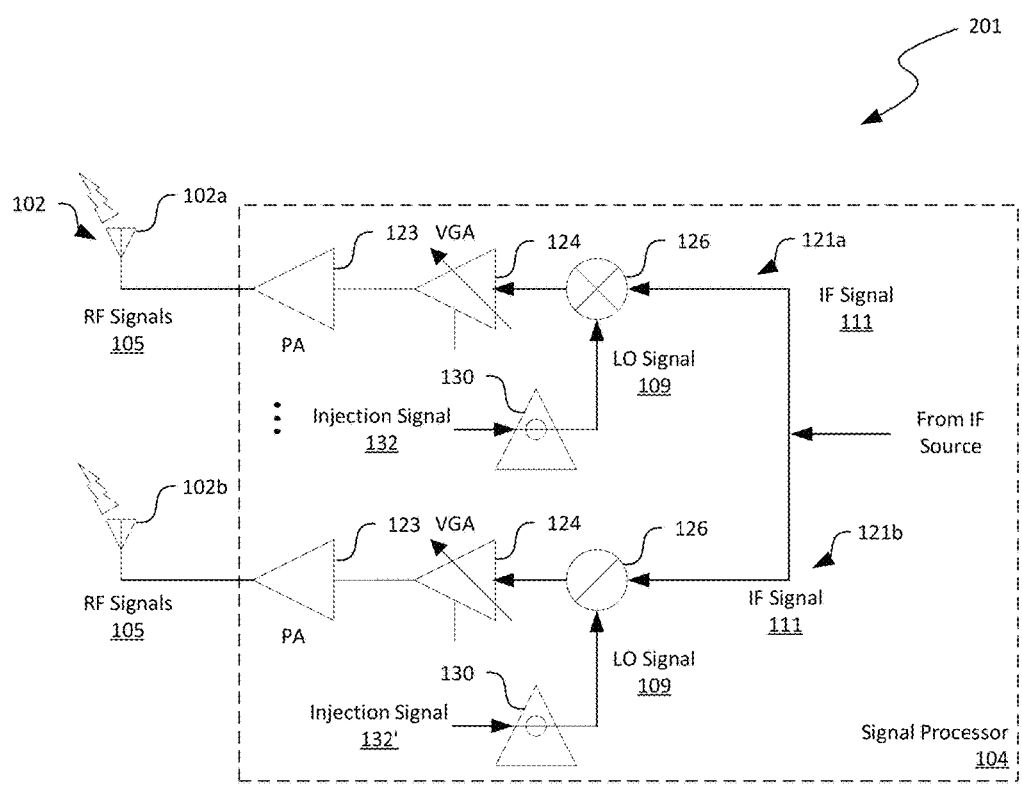
FIG. 9 is a schematic circuit diagram showing an example radio transmitter in accordance with embodiments of the disclosed technology.

Even though the disclosed technology is described above with reference to the radio receiver 101 in FIGS. 1-2, in other embodiments, the disclosed technology can also be used as a transmitter or transceiver. FIG. 9 is a schematic circuit diagram showing an example radio transmitter 201 in accordance with embodiments of the disclosed technology. As shown in FIG. 9, the radio transmitter 201 includes generally the same or at least similar components as the radio receiver 101 in FIG. 2 except the radio transmitter 201 includes a power amplifier 123 instead of a lower noise amplifier 122 coupled to the antennas 102. In addition, the flow direction of signals for the radio transmitter 201 are reversed as compared to the radio receiver 101 in FIGS. 1-2. For instance, the mixer 126 in each of the branches 121*a* and 121*b* can combine the local oscillator signal 109 with the IF signal 111 to generate a high frequency RF signal 105. The VGA 124 and the PA 123 can then scale or amplify the generated RF signal 105 before transmitting the same via the corresponding antennas 102*a* and 102*b*.

From the foregoing, it will be appreciated that specific embodiments of the technology have been described herein for purposes of illustration, but that various modifications may be made without deviating from the disclosure. In addition, many of the elements of one embodiment may be combined with other embodiments in addition to or in lieu of the elements of the other embodiments. Accordingly, the disclosure is not limited except as by the appended claims.

We claim:

1. An electronic device, comprising:
   one or more antennas configured to individually capture a radio frequency signal;
   a local oscillator configured to generate a local oscillation signal having a target frequency, the local oscillator having:
      a first transistor and a second transistor;
      a transformer cross-coupling the first transistor to the second transistor, the transformer including a first transformer inductor magnetically coupled to a second transformer inductor; and
   a resonance tank configured to generate an injection signal at the target frequency, the resonance tank having an injection inductor magnetically coupled to the transformer to inject the injection signal, wherein the injection inductor is magnetically coupled to both the first transformer inductor and the second transformer inductor; and
   a mixer coupled to the one or more antennas and the local oscillator, the mixer being configured to receive the captured radio frequency signal and the local oscillation signal and generate an intermediate frequency signal based thereon.

2. The electronic device of claim 1 wherein:
   the first transformer inductor couples collector of the first transistor to base of the second transistor; and the second transformer inductor couples collector of the second transistor to base of the first transistor.

3. The electronic device of claim 1 wherein:
the injection inductor is magnetically coupled to the first transformer inductor with a subtractive relative polarity; and
the injection inductor is magnetically coupled to the second transformer inductor with an additive relative polarity.

4. The electronic device of claim 1 wherein:
the injection inductor is magnetically coupled to both the first transformer inductor and the second transformer inductor with a same coupling factor but different directions of coupling.

5. The electronic device of claim 1 wherein:
the injection inductor is magnetically coupled to the first transformer inductor with an additive relative polarity; and
the injection inductor is magnetically coupled to the second transformer inductor with a subtractive relative polarity.

6. The electronic device of claim 1, further comprising a phase angle controller configured to provide a tuning signal to base of the first and second transistors, thereby generating the local oscillation signal having the target frequency and a target phase angle.

7. The electronic device of claim 1 wherein the resonance tank further includes:
a third transistor having a base, a collector, and an emitter;
a resonance capacitor coupled between the collector and the emitter of the third transistor; and
wherein the injection inductor is coupled to the collector of the third transistor.

8. A local oscillator circuit, comprising:
a first transistor and a second transistor individually having a base, a collector, and an emitter;
a transformer having a first transformer inductor magnetically coupled to a second transformer inductor, wherein:
the first transformer inductor couples the collector of the first transistor to the base of the second transistor;
the second transformer inductor couples the collector of the second transistor to the base of the first transistor; and
the first transformer inductor and the second transformer inductor have an additive relative polarity.

9. The local oscillator circuit of claim 8, further comprising a resonance tank configured to generate an injection signal at the target frequency, the resonance tank having an injection inductor magnetically coupled to both the first and second transformer inductors of the transformer.

10. The local oscillator circuit of claim 8, further comprising:
an output inductor having a first end and a second end;
wherein the collector of the first transistor is coupled to the first end of the output inductor; and
wherein the collector of the second transistor is coupled to the second end of the output inductor.

11. The local oscillator circuit of claim 8, further comprising a resonance tank having:
a third transistor having a base, a collector, and an emitter;
a resonance capacitor coupled between the collector and the emitter of the third transistor; and
an injection inductor coupled to the collector of the third transistor, wherein the injection inductor has an inductance and the resonance capacitor has a capacitance according to the following:

$$f_{LO} = \frac{1}{2\pi\sqrt{L_{inj}C_{res}}}$$

where $f_{LO}$ is a frequency of an output signal of the local oscillator circuit.

12. The local oscillator circuit of claim 8, further comprising a resonance tank having:
a third transistor having a base, a collector, and an emitter;
a resonance capacitor coupled between the collector and the emitter of the third transistor; and
an injection inductor coupled to the collector of the third transistor, wherein the injection inductor is magnetically coupled to both the first transformer inductor and the second transformer inductor.

13. The local oscillator circuit of claim 8, further comprising a resonance tank having:
a third transistor having a base, a collector, and an emitter;
a resonance capacitor coupled between the collector and the emitter of the third transistor; and
an injection inductor coupled to the collector of the third transistor, wherein:
the injection inductor is magnetically coupled to the first transformer inductor with a subtractive relative polarity; and
the injection inductor is magnetically coupled to the second transformer inductor with an additive relative polarity.

14. The local oscillator circuit of claim 8, further comprising:
a resonance tank having
a third transistor having a base, a collector, and an emitter;
a resonance capacitor coupled between the collector and the emitter of the third transistor;
an injection inductor coupled to the collector of the third transistor, wherein:
the injection inductor is magnetically coupled to the first transformer inductor with a subtractive relative polarity; and
the injection inductor is magnetically coupled to the second transformer inductor with an additive relative polarity; and
a phase shifter coupled to the base of the third transistor, the phase shifter being configured to controllably generate a phase shift to an injection signal having a frequency that is sub-harmonic to a frequency of an output signal of the local oscillator circuit.

15. The local oscillator circuit of claim 14 wherein the phase shifter is configured to generate a phase shift of 180°/N, where N is a sub-harmonic number of the injection signal.

16. The local oscillator circuit of claim 8, further comprising a resistor having one end coupled to the base of the first or second transistor and a second end coupled to a tuning signal.

17. A local oscillator circuit, comprising:
a first transistor and a second transistor individually having a base, a collector, and an emitter;
a transformer having a first transformer inductor magnetically coupled to a second transformer inductor, the first transformer inductor coupling the collector of the first transistor to the base of the second transistor and the second transformer inductor coupling the collector of the second transistor to the base of the first transistor; and an injection inductor magnetically coupled to both the first and second transformer inductors of the transformer to inject an injection signal having a target frequency for the local oscillator circuit.

18. The local oscillator circuit of claim 17 wherein:
the injection inductor is magnetically coupled to the first transformer inductor with a subtractive relative polarity; and
the injection inductor is magnetically coupled to the second transformer inductor with an additive relative polarity.

19. The local oscillator circuit of claim 17, further comprising:
a third transistor having a base, a collector, and an emitter;
a resonance capacitor coupled between the collector and the emitter of the third transistor; and
wherein the injection inductor is coupled to the collector of the third transistor; and wherein the injection inductor has an inductance and the resonance capacitor has a capacitance according to the following:

$$f_{LO} = \frac{1}{2\pi\sqrt{L_{inj}C_{res}}}$$

where $f_{LO}$ is the target frequency of an output signal of the local oscillator circuit.

20. The local oscillator circuit of claim 17, further comprising a first resistor having one end coupled to base of the first transistor and a second end coupled to a tuning signal, and a second resistor having one end coupled to base of the second transistor and a second end coupled to the tuning signal, the tuning signal being corresponding to a target phase angle of an output signal of the local oscillator circuit.

* * * * *